(12) United States Patent
Crowley et al.

(10) Patent No.: US 6,396,130 B1
(45) Date of Patent: May 28, 2002

(54) SEMICONDUCTOR PACKAGE HAVING MULTIPLE DIES WITH INDEPENDENTLY BIASED BACK SURFACES (75) Inventors: Sean T. Crowley, Phoenix; Bradley D. Boland, Gilbert, both of AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/953,422

(22) Filed: Sep. 14, 2001

(51) Int. Cl.$^7$ .............................................. H01L 23/495
(52) U.S. Cl. ...................... 257/666; 257/675; 257/706; 257/707
(58) Field of Search ................................ 257/666, 705, 257/707, 675; 438/123; 361/813

(56) References Cited

U.S. PATENT DOCUMENTS

| | | | |
|---|---|---|---|
| 3,930,114 A | 12/1975 | Hodge | 174/52 FP |
| 4,470,507 A | 9/1984 | Burns | 206/330 |
| 5,084,753 A | 1/1992 | Goida et al. | 357/70 |
| 5,091,341 A | 2/1992 | Asada et al. | 437/212 |
| 5,278,446 A | 1/1994 | Nagaraj et al. | 257/707 |
| 5,334,872 A | 8/1994 | Ueda et al. | 257/675 |
| 5,381,042 A | 1/1995 | Lerner et al. | 257/712 |
| 5,408,127 A | * 4/1995 | Mostafazadeh | 257/676 |
| 5,428,245 A | * 6/1995 | Lin et al. | 257/666 |
| 5,442,234 A | 8/1995 | Liang | 257/675 |
| 5,486,720 A | 1/1996 | Kierse | 257/659 |
| 5,506,446 A | 4/1996 | Hoffman et al. | 257/674 |
| 5,519,576 A | 5/1996 | Moore | 361/723 |
| 5,552,966 A | * 9/1996 | Nagano | 257/666 |
| 5,583,372 A | 12/1996 | King et al. | 257/676 |
| 5,594,234 A | 1/1997 | Carter, Jr. et al. | 257/676 |
| 5,619,070 A | 4/1997 | Kozono | 257/692 |
| 5,639,694 A | 6/1997 | Diffenderfer et al. | 437/209 |
| 5,646,831 A | 7/1997 | Manteghi | 361/813 |
| 5,650,592 A | 7/1997 | Cheskis et al. | 174/52.4 |
| 5,691,567 A | 11/1997 | Lo et al. | 257/675 |
| 5,701,034 A | 12/1997 | Marrs | 257/706 |
| 5,757,070 A | 5/1998 | Fritz | 257/675 |
| 5,796,160 A | 8/1998 | Kozono | 257/675 |
| 5,801,435 A | 9/1998 | Otsuki | 257/675 |

(List continued on next page.)

FOREIGN PATENT DOCUMENTS

| | | | | |
|---|---|---|---|---|
| JP | 6-151685 | * | 5/1994 | 257/666 |
| JP | 6-23659 | * | 8/1994 | 257/666 |

Primary Examiner—Jasmine J B Clark
(74) Attorney, Agent, or Firm—Skjerven Morrill LLP (57) ABSTRACT A thin, thermally efficient, lead frame-type of semiconductor package incorporating multiple dies includes a plurality of electrically conductive leads held together in a spaced, planar relationship about a central opening defined by the leads, and a plurality of thick, plate-like heat sinks supported within the opening such they are generally coplanar with each other, parallel to the plane of the leads, and electrically isolated from the leads and each other. Each of the heat sinks has a lower surface that can be exposed through the outer surface of a molded resin envelope encapsulating the package for the efficient dissipation of heat therefrom, and an upper surface having a recess formed into it. A semiconductor die is mounted in each of the recesses with its back surface in electrical connection with the floor of the recess. Each recess defines a wire bonding ring around the periphery of the upper surface of the respective heat sink immediately adjacent to the edges of the corresponding die for the bonding thereto of wires from the die and/or the leads. The package enables the back surface of each die to be independently biased to the same or a different electrical potential, provides enhanced heat dissipating capabilities and an improved resistance to penetration by moisture, and yields a wire-bonding region that substantially shortens the length of wires bonded thereto and reduces the residual shear stresses acting on the bonds.

30 Claims, 6 Drawing Sheets

U.S. PATENT DOCUMENTS

| | | | |
|---|---|---|---|
| 5,804,468 A | 9/1998 | Tsuji et al. | 438/122 |
| 5,825,623 A | 10/1998 | Lee et al. | 361/707 |
| 5,843,808 A | 12/1998 | Karnezos | 438/121 |
| 5,854,511 A | 12/1998 | Shin et al. | 257/713 |
| 5,905,299 A | 5/1999 | Lacap | 257/666 |
| 5,929,514 A | 7/1999 | Yalamanchili | 257/676 |
| 5,936,837 A | 8/1999 | Scribner et al. | 361/704 |
| 6,005,778 A | 12/1999 | Spielberger et al. | 361/770 |
| 6,049,977 A | 4/2000 | Atkins et al. | 29/843 |
| 6,064,115 A | 5/2000 | Moscicki | 257/706 |
| 6,084,777 A | 7/2000 | Kalidas et al. | 361/707 |
| 6,093,960 A | 7/2000 | Tao et al. | 257/706 |
| 6,198,163 B1 | 3/2001 | Crowley et al. | 257/706 |
| 6,184,585 B1 * | 2/2002 | Martinez et al. | 257/777 |

* cited by examiner

SEMICONDUCTOR PACKAGE HAVING MULTIPLE DIES WITH INDEPENDENTLY BIASED BACK SURFACES

BACKGROUND

1. Technical Field:

This invention pertains to semiconductor packaging.

2. Related Art:

Integrated circuits ("ICs") are formed on a single die, or "chip," cut from a semiconductor wafer. The dies are relatively small, fragile, susceptible to harmful environmental elements, particularly moisture, and generate a relatively large amount of heat in a relatively small volume during operation. Accordingly, ICs must be packaged in affordable, yet robust packages that protect them from the environment, enable them to be reliably mounted and interconnected with associated electronic components, and effectively dissipate the heat they generate during operation.

The demand for electronic devices that are smaller, yet more functional, has resulted in the development of techniques for incorporating multiple dies in a single package, including techniques for "stacking" the dies on top of one another, or alternatively, arrayed in a coplanar relationship on a substrate. Another demand has been for packages in which the back surfaces of the dies can be biased to a specific electrical potential, e.g., ground ("$V_{ss}$"), or a supply voltage ("$V_{cc}$").

SUMMARY

This invention provides a thin, affordable, small-outline, lead frame semi-conductor package having multiple, generally coplanar dies of the same or different sizes in which the back surfaces of each die can be separately biased to the same or to a different electrical potential. The package includes a plurality of electrically conductive leads held together in a spaced, planar relationship about a central opening defined by the leads, and a plurality of thick, plate-like heat sinks supported within the opening such they are generally coplanar with each other, parallel to the plane of the leads, and electrically isolated from the leads and each other.

Each of the heat sinks has an upper surface with a recess in it and a lower surface that can be exposed through the outer surface of a molded resin envelope encapsulating the package for the efficient dissipation of heat therefrom. A semi-conductor die is mounted in each of the recesses with its back surface in good thermal and electrical connection with the floor of the recess.

Each recess defines a wire bonding ring around the periphery of the upper surface of the respective heat sink immediately adjacent to the edges of the corresponding die for the bonding thereto of conductive wires from the die and/or the leads. The package enables the back surface of each die to be independently biased to the same or a different electrical potential, provides enhanced heat dissipating capabilities and an improved resistance to penetration by moisture, and yields a wire-bonding region that substantially shortens the length of wires bonded thereto and reduces the residual shear stresses acting on the bonds.

The present invention is best understood by reference to the following detailed description when read in conjunction with the accompanying drawings.

DESCRIPTION OF THE DRAWINGS

Common reference numerals are used throughout the drawings and detailed description to indicate like elements.

DETAILED DESCRIPTION

This invention incorporates many of the features of U.S. Pat. No. 6,198,163 to S. T. Crowley, et al., which is commonly owned by the assignee hereof. The disclosures of that patent are incorporated herein in their entireties by this reference.

Figure 1:
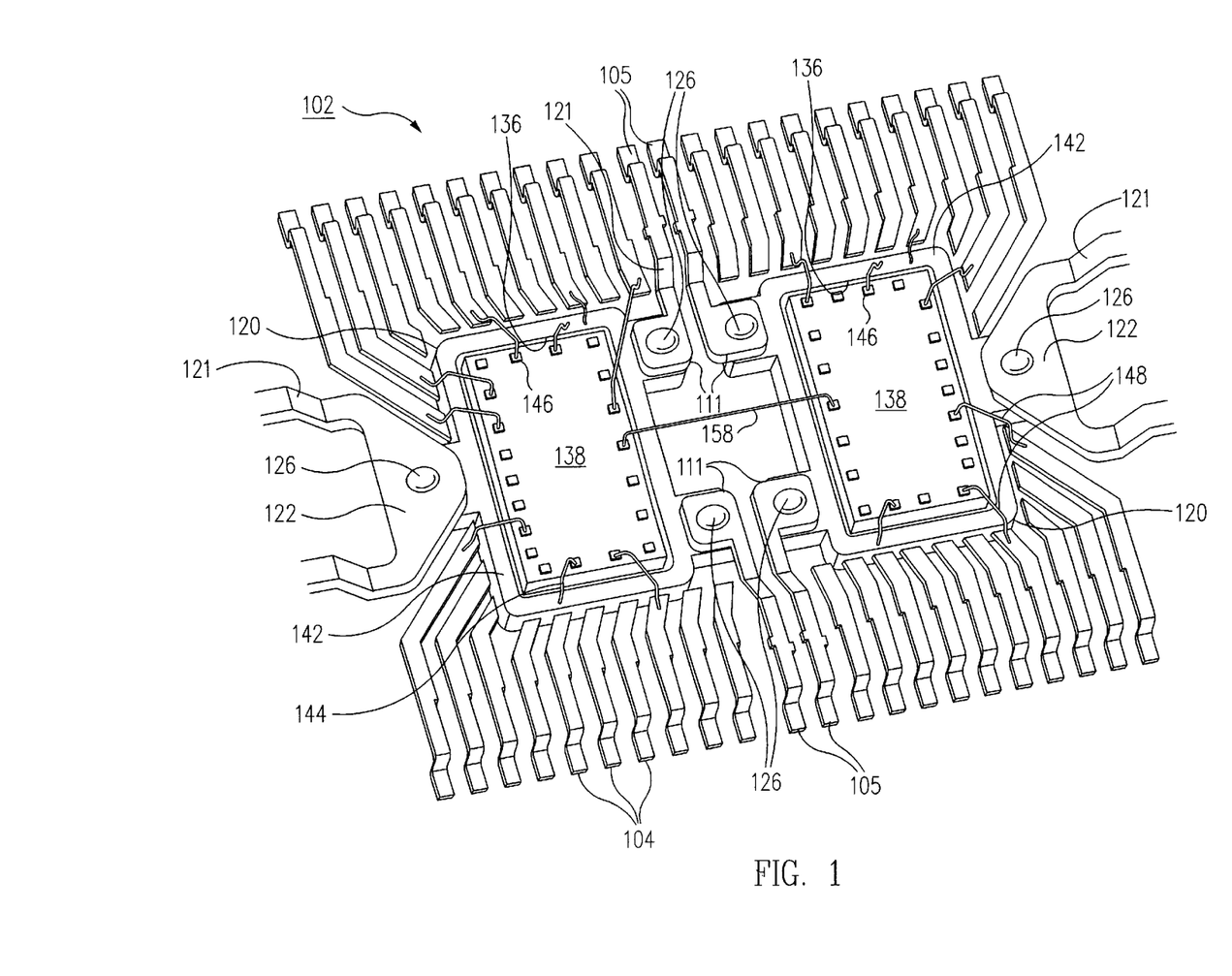
FIG. 1 is an isometric view of a thin, thermally efficient, lead frame-type of semiconductor package incorporating multiple, coplanar dies with back surfaces that can be independently biased to the same or different electrical potentials in accordance with the present invention, wherein the molded plastic body of the package has been omitted to reveal the underlying details.

FIG. 1 is an isometric view of a novel, thermally enhanced lead frame 102 for a thin, thermally efficient semiconductor package 100 that incorporates a plurality of generally coplanar semiconductor dies 138, each with back surfaces that can be independently biased to the same or different electrical potentials in accordance with one of several possible embodiments of the present invention.

Figure 2:
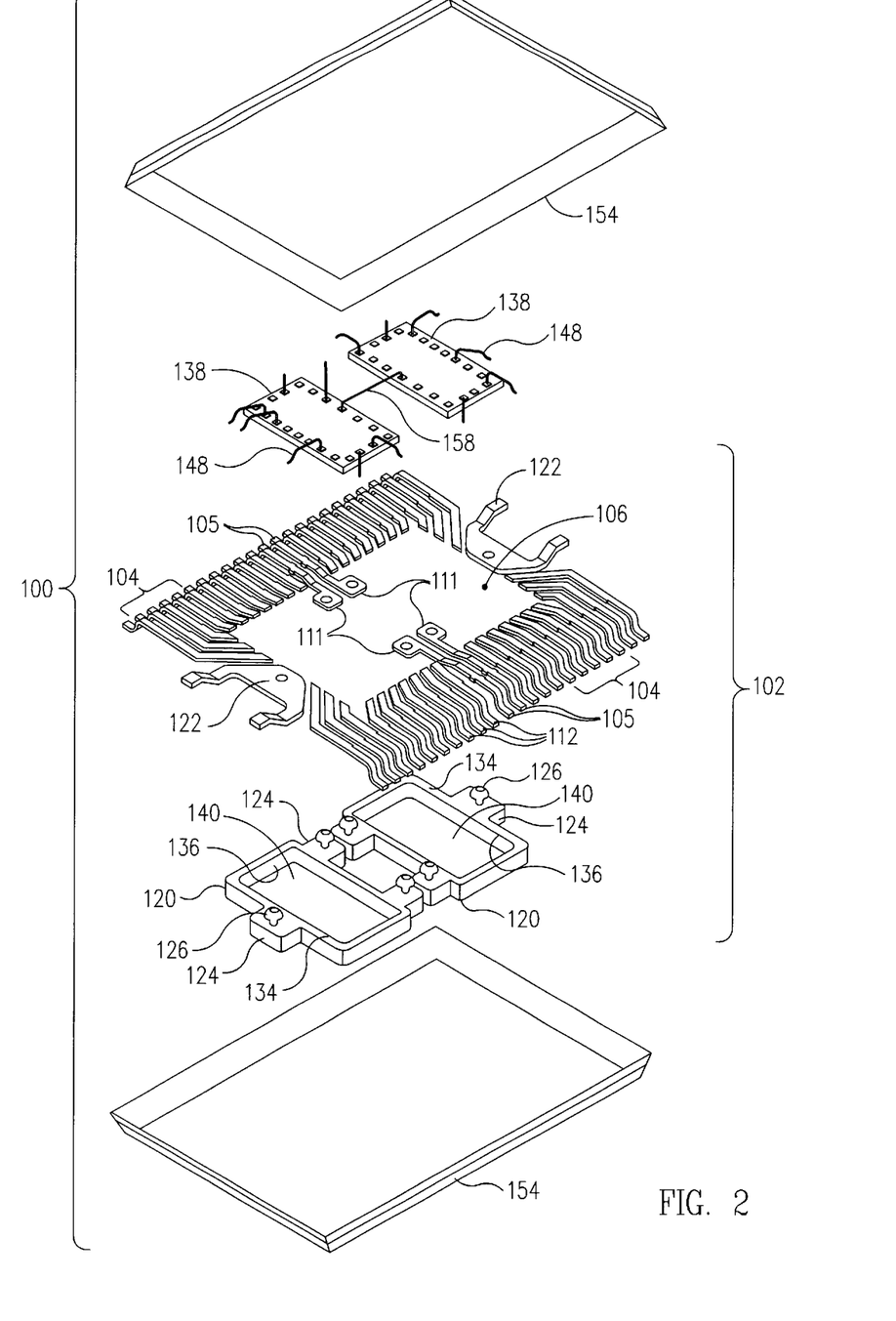
FIG. 2 is an exploded isometric view of the semiconductor package shown in FIG. 1.

The package 100 and its constituent parts, including the leadframe 102, are shown in an exploded isometric view in FIG. 2. The particular package 100 illustrated in the figures corresponds to a JEDEC Standard Outline No. MO-166, viz., a Plastic Small Outline Heat Slug Package ("H-PDSO-G" or "PSOP"), having two dies 138 of the same size and 22 leads on each of two opposite sides thereof, for a total of 44 leads. However, it should be understood that this particular configuration is illustrated for exemplary purposes, and that the invention is not limited to such, but rather, is applicable to a wide variety of package forms, including those having a larger number of dies of the same or different sizes, and to those having more or fewer leads on either of two or four sides thereof.

Figure 3:
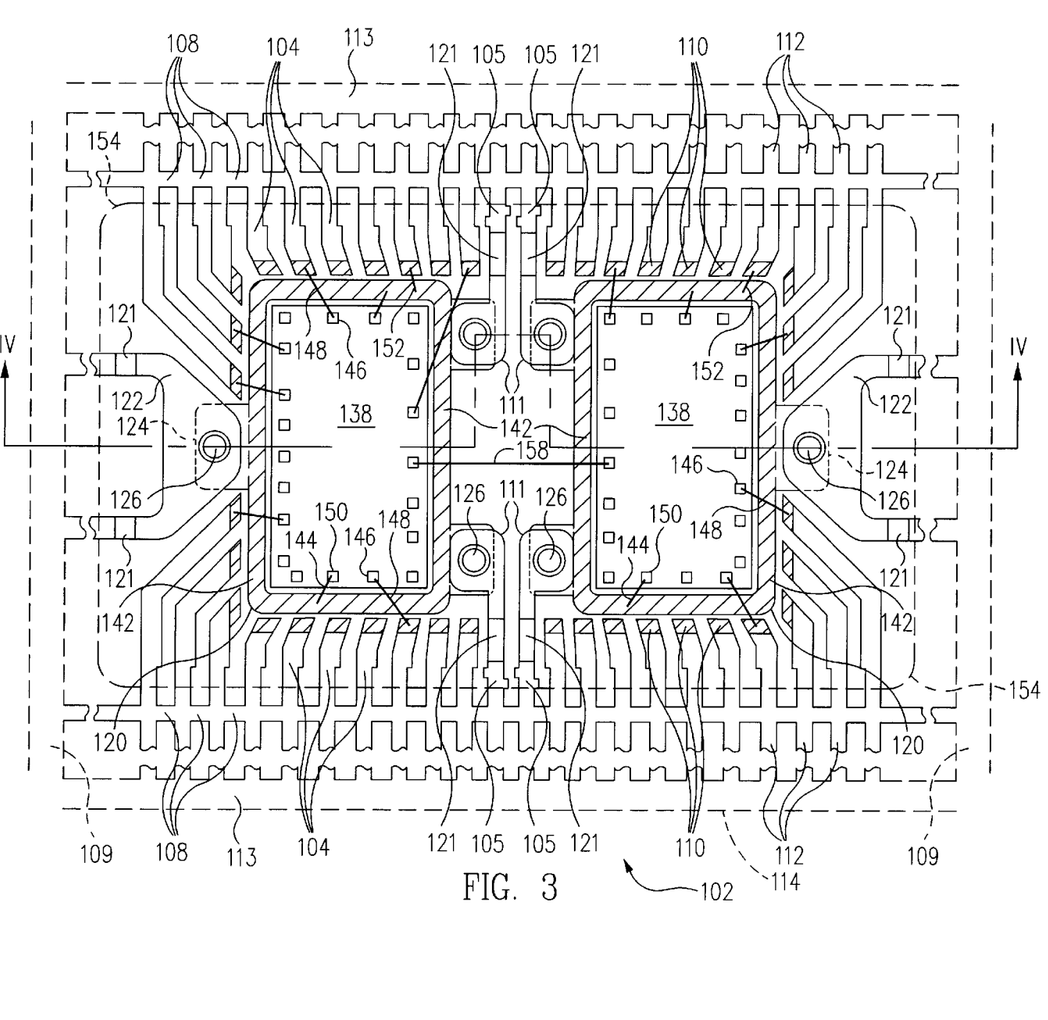
FIG. 3 is a top plan view of the package illustrated in FIG. 1 at a stage in its manufacture after encapsulation but prior to debar, trim, and lead forming steps.
Figure 4:
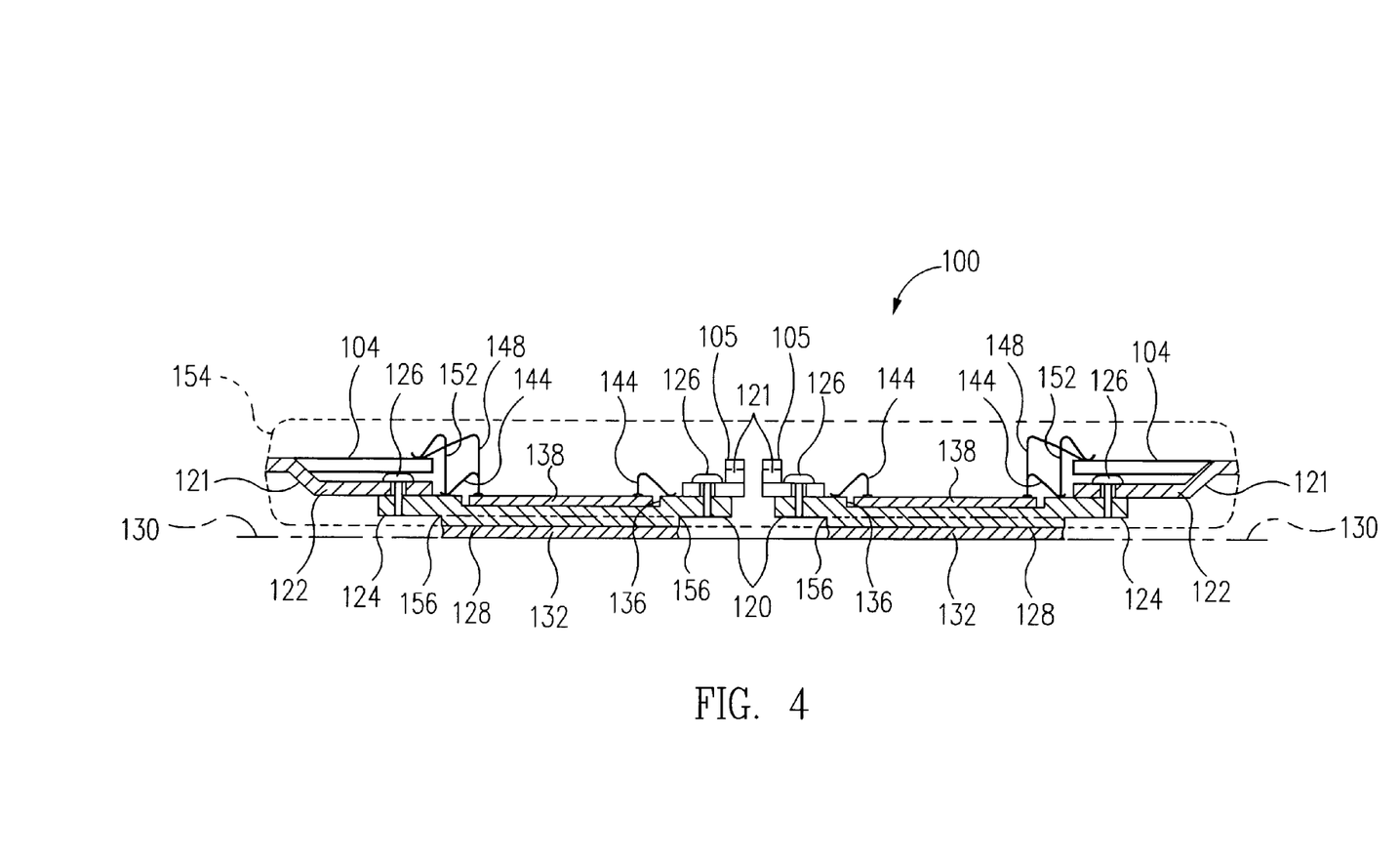
FIG. 4 is a cross-sectional elevation view of the package shown in FIG. 3, as revealed by the section taken along the lines IV—IV therein.

FIG. 3 is a top plan view of the package 100, with the encapsulating plastic package body 154 shown in dashed outline to reveal the details of the underlying leadframe 102, which includes a plurality of electrically conductive metal leads 104. The leads define a central region having an opening 106 (see FIG. 2), and are held together in a spaced, planar arrangement about the opening by a rectangular frame (shown by dashed lines) that includes two pairs of longitudinal and lateral frame members 108 and 109 (FIG. 3). The disposable frame members 108 and 109 act as "dam bars" in cooperation with a mold (not illustrated) used to encapsulate the package, and are cut away from the lead frame and discarded after encapsulation is completed.

Each of the leads 104 includes an inner portion 110 and an outer portion 112 extending in opposite directions from a respective one of the two parallel frame members 108. The inner portion 110 of the leads has a first end integral with the frame member 108 and an opposite, second end adjacent to the central opening 106. The outer portion 112 of each lead has a first end integral with the frame member 108, and an opposite, second end that extends to one of a pair of expendable outer members 113 of the frame. In FIGS. 1 and 2, the package 100 and the leadframe 102 are shown after the expendable frame members 108, 109, and 113 have been removed and discarded, in a process described in more detail below.

In the embodiment shown in FIG. 3, the leadframe 102 comprises one of a plurality of identical leadframes attached end-to-end in the form of a continuous strip 114, and may be deployed in that form for the sequential or simultaneous manufacture thereon of a plurality of semiconductor packages 100. Following completion of the fabrication process, the individual packages 100 are separated from the strip 114 and from each other by a cutting operation that removes the expendable frame members 108, 109, and 113 from the leads 104 and bends the outer portions 112 of the leads into the desired mounting configuration, such as the surface-mounting configuration illustrated in FIGS. 1–4. Those of skill in the art will appreciate that the leads 104 can also be formed differently than as shown to accommodate other package mounting configurations.

The strip 114, including the frame members 108 and the leads 104, with their respective inner and outer portions 110, 112 completely defined thereon, can be formed, e.g., by die-stamping or etching them from a sheet, or "flat-stock," of an electrically conductive metal, such as a copper, aluminum, or nickel-iron alloy (e.g., Kovar, or "Alloy 47"). As shown by the cross-hatched areas in FIG. 3, the inner portions 110 of the leads 104 may be plated with a material that facilitates the bonding of fine, conductive wires to the leads, e.g., silver, gold, platinum, nickel, or a layered combination of the foregoing metals.

The lead frame 102 also includes a plurality of separate, plate-like "heat slugs," or "heat sinks," 120 that are attached to the lead frame and are made of a material that is both electrically and thermally conductive, e.g., a soft, oxygen-free copper, or an alloy thereof. In the embodiments illustrated in FIGS. 1–6, each of the heat sinks, or plates 120, is individually attached to and supported by the lead frame 102 by staking it to two or more support members 122 extending from the frame members 108 and/or 109 on respective sides of the central opening 106 such that the plates are held side-by-side in a generally coplanar relationship with each other within the central opening 106 and parallel to the plane of the leads 104 (see FIGS. 3 and 4). As illustrated, the support members can advantageously comprise selected ones of the leads 105 having inner end portions 111 that extend into the central opening 106 between adjacent ones of the heat sinks 120, and which are "modified," i.e., extended, broadened, down-set, and pierced with stake-receiving apertures, for connecting to and supporting respective ones of the heat sinks, such as those shown supporting the two interior corners of each of the two plates in FIGS. 1–4. Alternatively (or additionally), the support members can take the form of the bifurcated support members 122 shown supporting the opposite ends of the two heat sinks 120 illustrated in the figures.

Figure 5:
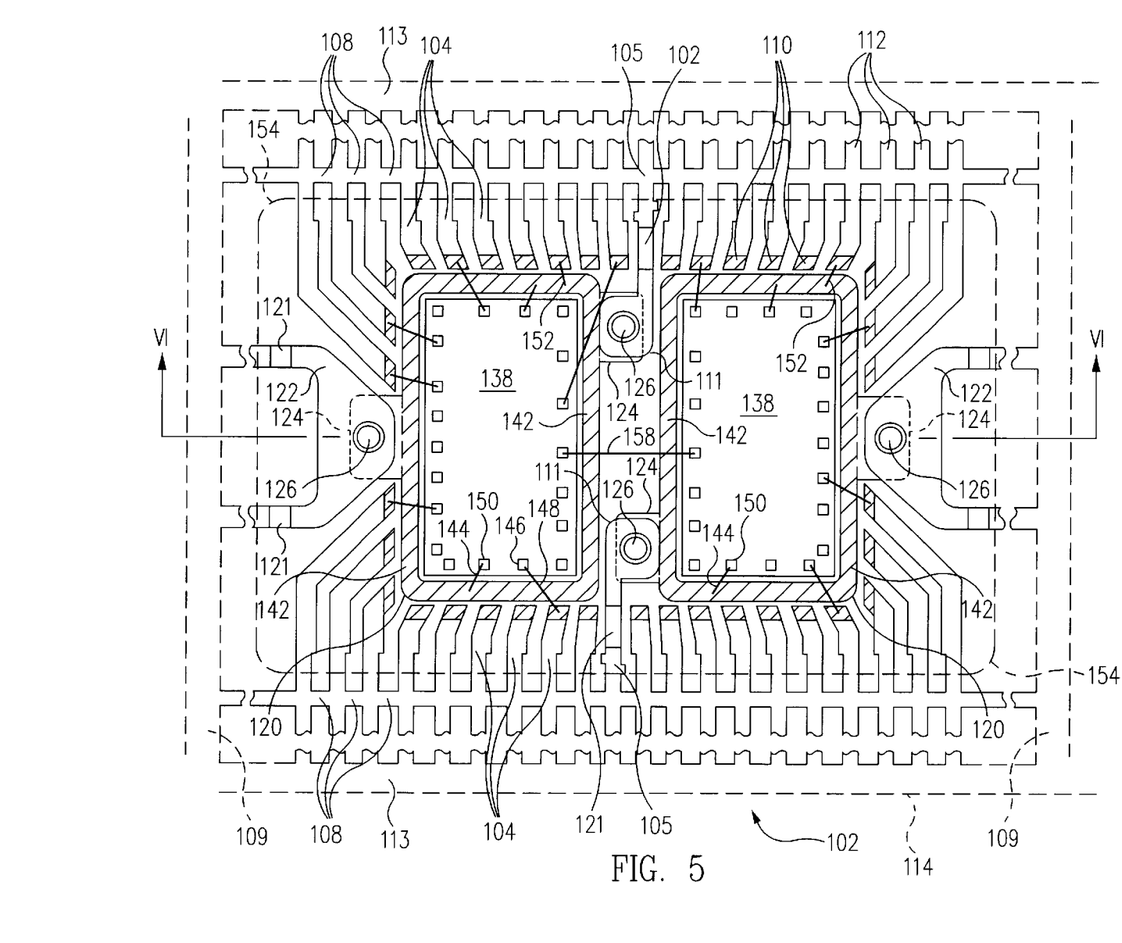
FIG. 5 is a top plan view of an alternative embodiment of a package at a stage in its manufacture after encapsulation but prior to debar, trim, and lead forming steps; and, FIG. 6 is a cross-sectional elevation view of the alternative embodiment of the package shown in FIG. 5, as revealed by the section taken along the lines VI—VI therein.
Figure 6:
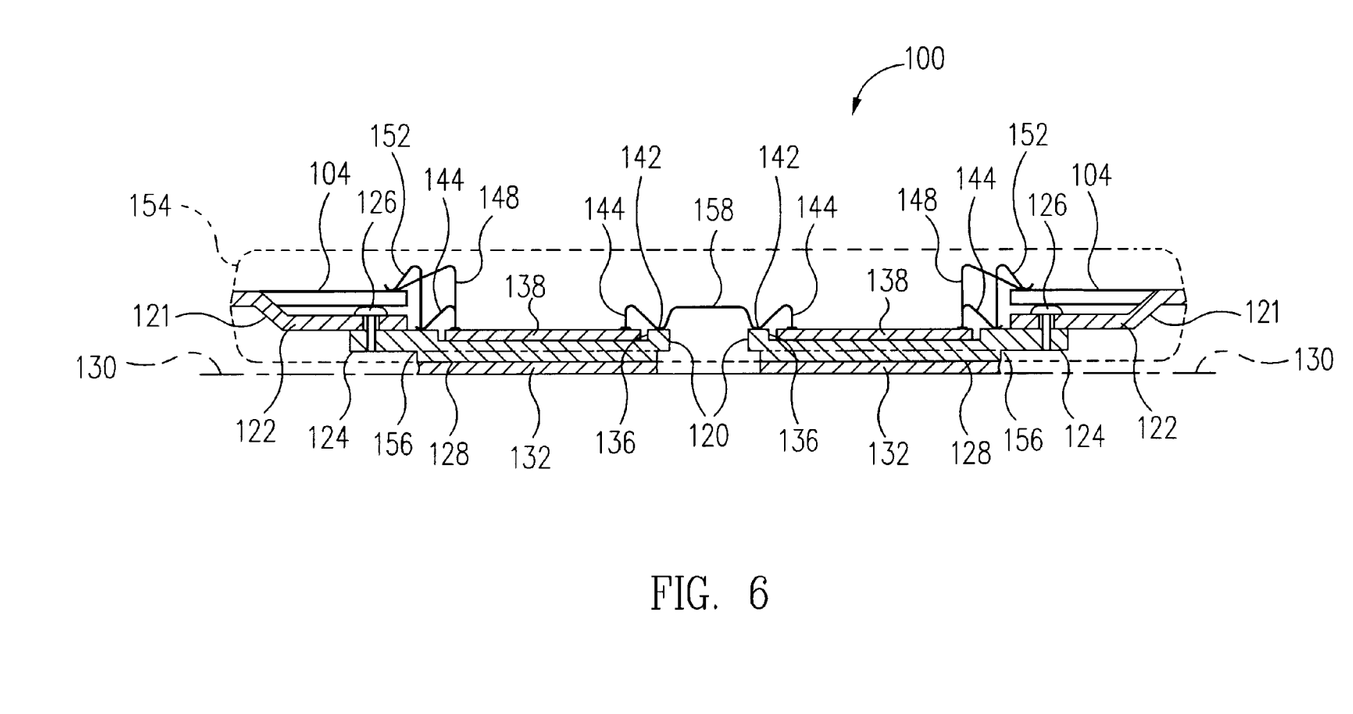

In the alternative embodiment of lead frame 102 illustrated in FIGS. 5 and 6, each of the heat sinks 120 is supported at one end by one bifurcated support member 122 connected to a respective end thereof, and by a single modified lead 105 at the opposite end thereof that extends into the central opening 106 between the two adjacent heat sinks and connects to a respective corner thereof.

The vertical position of each heat sink 120 relative to the leads 104 can be adjusted independently of the other heat sinks such that it is held above, below, or coplanar with the plane of the leads by simply adjusting the amount of up-set or down-set formed in the inner ends of the respective support members 122 and/or 105 supporting it. In the two alternative embodiments respectively shown in FIGS. 4 and 6, the inner ends of the respective support members 122, 105 for both heat sinks 120 have been formed with a down-set 121, i.e., so as to support the plane of the heat sink 120 below the plane of the leads 104. Outward of the down-set 121, the support members 105, 122 lie in the plane of the leads 104.

By providing heat sinks 120 that are separate and distinct from the leads 104 and support members 105, 122, the former can be made thicker, and preferably, at least twice as thick, as the latter, and can thus incorporate certain advantageous features described below that are not possible in a conventional die-mounting pad that is stamped simultaneously with the leads from a thin sheet of flat-stock. Thus, in one advantageous embodiment of the lead frame 102, the heat sink 120 may be 0.050 in. (1.27 mm) thick, compared to a lead thickness of 0.008–0.010 in. (0.203–0.254 mm), i.e., nearly 5× thicker. Of course, while it is theoretically possible to stamp conventional leadframes from a thicker stock of material, this quickly becomes impractical with increasing thicknesses of stock for reasons of increased cost, package size, and manufacturing complexity.

The heat sinks 120 are formed to include the mechanical features described below by, e.g., "coining" a blank, or "coupon," of a soft metal, e.g., pure copper, between two precision-made steel dies. However, they can also be fabricated by a number of other techniques as well, including forging, hydro-forming, electrical-discharge-machining ("EDM"), or as a precision die- or investment-casting. It is therefore desirable, at least in packages having similarly sized dies 138, for the heat sinks 120 to be identical to one another in terms of size and configuration, to reduce tooling and inventory costs, but this may not be possible in embodiments where the dies differ greatly from one another in size.

In the embodiment illustrated in the figures, the heat sinks 120 are shown attached to the leadframe 102 by "staking" them to the respective support members 122, 105, i.e., by forming, such as with a punching operation, a small, upstanding "stake," or pin, on each of two or more corresponding mounting flanges 124 located on the sides and/or corners of the heat sinks, inserting each of the stakes into an aperture in a corresponding one of the support members 122, 105 and upsetting the upper ends of the stakes to form a head 126 thereon that securely fastens the heat sink to the leadframe. However, the heat sinks 120 can also be attached to the support members 122, 105 by other methods, including by riveting, brazing, welding, soldering, or by bonding them thereto with an adhesive. Also, while each of the heat sinks 120 is shown in the figures as being respectively supported by at least two associated support members 122, 105 at opposite ends thereof, it should be understood they can also be attached to the lead frame 102 by different numbers of support members having different shapes and different distributions around the periphery of the central opening 106, than those illustrated.

As illustrated in FIG. 2, each of the heat sinks 120 has a first, upper surface 134, and a second, lower surface 128 opposite thereto. The second surface 128 of each heat sink 120 can be exposed through and flush with the outer surface of the package 100 for the efficient dissipation of heat from the package and into a surface 130 of, e.g., a corresponding mounting pad on a PCB to which the package is mounted and electrically connected (see cross-sectional, side elevation views of FIGS. 4 and 6). In this regard, it is possible to expose the second surface 128 of any one or all of the heat sinks 120 independently of the others by simply adjusting the amount of down-set or up-set in the inner ends 110 of the support members 122 and/or 105 supporting respective ones of the heat sinks.

In one mounting embodiment, the respective second, or lower, surfaces 128 of the exposed heat sinks 120 are bonded to corresponding pads on a PCB with a joint 132 of a thermally conductive material, such as solder or a filled adhesive. In such an embodiment, it may be desirable to treat the second surface 128 of the exposed heat sinks 120 in a way that facilitates the formation of such a joint thereto, such as by etching it or plating it with a metal. As discussed in more detail below, if the joint 132 is also made of an electrically conductive material, this form of mounting also provides an alternative or additional means for independently biasing the back surfaces of the dies 138 mounted on the respective heat sinks 120 to the same or to different electrical potentials, viz., by simply electrically connecting the respective mounting pads to those respective potentials.

However, it should be understood that the package 100 of this invention is not limited to the foregoing mounting technique. Thus, for example, the outer portions 112 of the leads 104 of the package can be bent in the opposite direction from that shown in FIGS. 1 and 2, so that the package 100 mounts to a PCB with the respective second surfaces 128 of the heat sinks 120 facing up and away from the PCB, for contact with, e.g., a heat sink cooled by a fan or a thermoelectric cooler.

As illustrated in FIGS. 1, 3, and 5, the first, upper surface 134 of each heat sink 120 includes a recess 136 formed into it for the mounting of a corresponding semiconductor die 138 therein. Each of the recesses 136 has a planar floor 140 (see FIG. 2) disposed below and generally parallel to the first surface 134 of the respective heat sink. The back surface of the corresponding die 138 is attached to the floor 140 of the recess with, e.g., an adhesive that is both electrically and thermally conductive, or by soldering it thereto, e.g., with a "soft solder." The first surface 134 of each heat sink defines a wire-bonding ring 142 around the periphery of the recess 136 that is immediately adjacent to the edges of the die 138 mounted in the recess, and hence, particularly well adapted for the bonding thereto of extremely short "down-bonding" wires 144 extending from the die, and/or relatively short biasing wires 152 extending from the inner ends 110 of selected ones of the leads 104, as shown in FIGS. 3–6. For this purpose, the wire-bonding ring 142 may be plated with a metal, e.g., silver, gold or platinum, that facilitates wire bonding to it, as indicated by the cross-hatching shown in FIG. 3.

The dimensions of the heat sinks 120 will vary, depending upon the number and respective sizes of the dies 138 involved, and the dimensional, thermal, lead-pitch and other design constraints of the particular package involved. In the particular exemplary two-die, 44-lead PSOP package 100 shown in FIGS. 1–4, the heat sinks 120 are each 8.7 mm long×5.4 mm wide×1.27 mm thick, have an exposed lower surface that is 6.1 mm long×6.3 mm wide (38.4 mm$^2$), a wire bonding ring 142 that is 0.254 mm wide extending around the entire periphery of the recess 136, and each recess can accommodate a die 138 that is up to about 6.0 mm long×3.1 mm wide×0.55 mm thick. The body of the resulting "high-power" PSOP standard outline package 100 incorporating the leadframe 102 (i.e., exclusive of the leads 104) is about 15.9 mm long×11.0 mm wide×3.15 mm high, and the leads 104 are set at a pitch of about 0.65 mm.

The advantages of the relatively thicker heat sinks 120, when combined with the recesses 136 in their respective first, upper surfaces 134, are several. Among these is that they enable the provision of a very thin, thermally efficient, lead frame-type of semiconductor package 100 incorporating multiple, coplanar dies 138 with back surfaces that can be independently biased to the same or different electrical potentials. For example, it may be desirable to package two associated, but functionally different, dies in the same package, and further, to bias the back surface of one of the dies to, e.g., a "signal ground" potential, while biasing the back surface of the other die to, e.g., a "power supply ground" potential that is different from the former.

This independent biasing of the two dies can be readily and simply achieved in the package 100 of the present invention in three different ways. In the first of these, the wire-bonding rings 142 on respective ones of the heat sinks 120 are simply wire-bonded with conductive wires 152 to the inner ends 110 of selected ones of the leads 104, as described above, and seen in FIGS. 3–6. The heat sinks 120, and hence, the respective back surfaces of the corresponding dies 138, can then be independently biased to different electrical potentials by applying respective ones of the two potentials to respective ones of the selected leads.

In a second, independently biased embodiment, one or more of the support members 122 can comprise a lead 105 having an inner end portion 110 that is modified for electrically connecting to and supporting a respective one of the heat sinks 120, as described above and shown in FIGS. 1–6. The respective heat sinks 120, and hence, the back surfaces of the corresponding dies 138, can then be independently biased to different electrical potentials by applying respective ones of the two potentials to respective ones of the modified leads 105.

In a third, independently biased embodiment, the second, lower surfaces of the heat sinks 120 can each be exposed through the plastic body 154 encapsulating the package 100 and electrically connected to a corresponding conductive mounting pad on a heat sinking surface 130, e.g., a PCB, with a layer 132 of an electrically conductive material, e.g., solder, as described above and shown in FIGS. 4 and 6. The heat sinks 120, and hence, the respective back surfaces of the corresponding dies 138, can then be independently biased to different electrical potentials by applying respective ones of the two potentials to respective ones of the corresponding mounting pads on the PCB.

In addition to the foregoing advantages, an additional advantage of using a heat sink 120 that is thicker than a conventional thin die pad is that it positions the corresponding die 138 relatively higher in the package 100 than does the latter. While this re-positioning of the dies increases the thickness of the material between the dies and a heat-sinking surface 130, such as those illustrated in FIGS. 4 and 6, and hence, nominally increases the thermal resistance between the two, it also increases the distance that moisture must travel into the package 100 to reach the dies 138, thereby increasing the resistance of the package to penetration by moisture. This "labyrinthine" effect can be further enhanced by forming a recessed shoulder 156 (see FIGS. 4 and 6) around the exposed lower surface 128 of the heat sinks 120.

Additionally, the thicker heat sinks 120 also place the wire-bonding rings 142 on the upper surfaces of the heat sinks closer to the plane of the leads 104, where the residual shear stresses in the package acting on the wire-bonds is minimal, thereby substantially improving the reliability of the wire-bonds to that surface.

The recesses 136 in the heat sinks 120 also contribute the following additional packaging advantages. First, the recesses 136 effectively "re-position" the respective dies 138 in the package 100 to a position that is about the same as that occupied by a die mounted on a die pad in a conventional, "deep down-set" package, but without lowering the wire-bonding rings 142 defined by the recesses on the first, upper surfaces 134 of the respective heat sinks, where wire-bonds to the heat sinks are made. This reduces the thermal resistance between the dies 138 and a heat-sinking mounting surface 130 to about that of a thin die pad, while at the same time lowering the position of the upper surface of the die 138 until it is about coplanar with the wire-bonding ring 142, thereby desirably reducing not only the overall height of the package 100, but also the length of the respective wires 144 and 152 bonded between the dies, leads, and the heat sinks 120 to less than the length of such wires bonded to a conventional die pad or a heat sink without such a recess 136. The shorter wire bonds reduce parasitic inductances at higher frequencies and minimize the possibility of "wire sweep," and hence, wire breakage, during package encapsulation.

The recesses 136 also effectively increase the distance that moisture must penetrate into the package 100 to reach the dies 138, thereby further increasing the resistance of the package to long-term penetration by moisture to more than four times that of conventional leadframe packages. In this regard, it may also be noted that, in comparison to a conventional leadframe, the separately attached, recessed heat sinks 120 define more and larger mechanical features on their respective surfaces, which serve to increase the area of adhesion between the leadframe and a plastic body 152 molded over it, thereby "locking" the leadframe more securely in the plastic and further increasing the resistance of the package 100 to penetration by moisture.

In addition to the above, it will be seen that the recesses 136 respectively define a "moat" between the edges of respective ones of the dies 138 and their corresponding wire-bonding rings 142 that prevents an excess of solder or adhesive used to attach the dies to the respective floors 140 of the respective recesses from flowing out onto the wire-bonding ring and contaminating it against the formation thereon of wire-bonds. This means that the "down-bonds," i.e., the wire-bonds 144 from the dies 138 to the corresponding heat sinks, as well as the biasing wire-bonds 152 thereto, can be made immediately adjacent to the edges of the die, rather than much further outboard of them, as is necessary in conventional leadframe packages, and hence, that the length of the down-bonding and biasing wires 144, 152 is desirably reduced even further.

Another advantage of the recesses 136 is that they interrupt the respective first, upper surfaces 134 of the heat sinks 120, and hence, the "flow" of residual shear stresses acting on those surfaces, thereby further reducing the shear stresses acting on the wire-bonds to that surface. Indeed, a comparison of thermal stress analyses performed on two equally thick heat sinks 120, both adapted for use in a TSSOP package, one with a recess 136 in it, and the other without, shows that the residual shear stress acting on the upper surface 134 of the heat sink with a recess in it is about 33% less than that acting on the upper surface of the equally thick heat sink without a recess. A similar comparison between the recessed heat sink 120 above and a thin (0.127 mm thick) TSSOP die pad of the prior art (not illustrated) shows that the residual shear stresses acting on the wire bonds to the recessed heat sink are about 70% less than those acting on the wire bonds to a conventional die pad.

In the manufacture of a low-profile semiconductor package 100 incorporating the enhanced leadframe 102 of the invention, a semiconductor die 138 is attached to the floor 140 of each of the recesses 136 using, e.g., solder, or a filled, electrically and thermally conductive epoxy adhesive. Wire-bonding pads 146 on the respective upper surfaces of the dies 138 are then conventionally wire-bonded to corresponding ones of the inner portions 110 of the conductive leads 104 by fine conductive wires 148 to allow signals and power to be transmitted between the respective dies and the leads. Other bonding pads 150 on the dies 138 may be down-bonded to the wire-bonding ring 142 on the corresponding heat sinks 120 using wires 144, e.g., to ground the die 138. Biasing wire bonds 152 can be made from the respective wire-bonding rings 142 to selected ones the leads 104 to independently bias the back surfaces of the respective dies 138, as described above. Additionally, it is also possible to interconnect the dies 138 to each other with wire bonds 158 located inside of the package 100, rather than requiring a connection external to the package, should that be desirable.

After wire-bonding is complete, the inner portions 110 of the leads 104 and the heat sinks 120, each having a corresponding wire-bonded die 138 mounted in the recess 136 therein, are then placed in a mold (not illustrated), and a protective envelope 154 (shown by dashed lines in FIGS. 3–6) of an insulative plastic, e.g., a molten epoxy resin, is molded over them so that only the outer portions 112 of the leads 104 and at least a portion of the respective lower surfaces 128 of selected ones of the heat sinks 120 are left exposed. The envelope 154 seals and protects the encapsulated parts against the environment. The package 100 is then finish-processed as described above, in which the frame members 108, 109, and 113 are removed and discarded, the leads 104 are bent into the desired mounting configuration, and the individual packages 100 separated, or "singulated," from the lead frame strip 114.

As will be evident by now, the exemplary embodiments of this invention provide a thin, thermally efficient, lead frame-type of semiconductor package incorporating multiple, coplanar dies with back surfaces that can be independently biased to the same or different electrical potentials, and exposed through the package for improved heat dissipation and the possible connection of a heat sink and/or a biasing voltage thereto. The package yields enhanced heat dissipating capabilities, an improved resistance to long-term penetration by moisture, and a heat sink wire-bonding surface that not only substantially shortens the length of biasing wires bonded thereto, but also subjects the bonds to a minimum of residual shear stress.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A lead frame for a semiconductor package, comprising:
   an expendable metal frame having a central region;
   a plurality of metal leads extending from an outer portion integral with the frame to an inner portion adjacent to the central region; and,
   a plurality of metal plates disposed in the central region, each plate including opposite first and second surfaces, the first surface of each plate being closer to the leads than the second surface thereof and including a recessed planar central portion and a peripheral portion surrounding the central portion, the peripheral portion defining a wire bonding surface adjacent to the leads, the wire bonding surface being plated with a material that facilitates the bonding of wires thereto.

2. The lead frame of claim 1, wherein each of the plates is supported by a respective plurality of metal support members, each of the support members having an inner end portion extending from the frame and connected to a respective one of the plates.

3. The lead frame of claim 1, wherein the plurality of leads and plates comprises a single unit in a plurality of identical units attached end-to-end in the form of a strip for the assembly of a plurality semiconductor packages thereon.

4. The lead frame of claim 1, wherein the second surface of each plate includes a recessed shoulder extending around a periphery thereof.

5. The lead frame of claim 1, wherein of each of the plates is formed by coining.

6. The lead frame of claim 1, wherein each of the plates has a thickness that is at least twice a corresponding thickness of the leads.

7. The lead frame of claim 2, wherein the inner end portions of the support members are down-set relative to the leads.

8. The lead frame of claim 2, wherein at least one of the support members connected to each plate comprises a lead.

9. The lead frame of claim 8, wherein the inner end portions of the at least one leads are connected to the respective plates with an electrically conductive connection.

10. The lead frame of claim 8, wherein the inner end portions of the at least one leads are down-set relative to the other leads.

11. A semiconductor package, comprising:
a package body formed of a dielectric encapsulating material;
a plurality of metal leads, each lead having a first portion encapsulated within the package body and a second portion extending out of the package body;
a plurality of metal plates disposed within the package body and electrically isolated from each other, each plate including a first surface adjacent to the first portions of the metal leads and a second surface opposite to the first surface, the first surface having a planar central portion and a planar peripheral portion surrounding the central portion, the central portion being recessed below the peripheral portion, and the peripheral portion defining a wire bonding surface that is parallel to and spaced apart perpendicularly from the first portions of the leads;
a plurality of semiconductor dies, each die having a back surface attached to and in electrical connection with the recessed central portion of a corresponding one of the plates; and,
means for electrically connecting each of the plates to a respective electric potential.

12. The semiconductor package of claim 11, wherein the means for electrically connecting each of the plates to a respective electric potential comprises an electrically conductive wire bonded between the wire bonding surface of a respective one of the plates and the inner portion of a respective one of the leads.

13. The semiconductor package of claim 11, wherein each plate is supported by a respective plurality of metal support members, each support member having a first portion encapsulated within the package body and connected to a respective one of the plates.

14. The semiconductor package of claim 11, wherein the means for electrically connecting each of the plates to a respective electric potential comprises at least a portion of the second surface of each of the plates being exposed through the package body.

15. The semiconductor package of claim 13, wherein at least one of the plurality of support members connected to each plate comprises a respective one of the leads, and wherein the means for electrically connecting each of the plates to a respective electric potential comprises the connection between the first portion of the respective lead and plate being an electrically conductive connection.

16. A lead frame for a semiconductor package, comprising:
a plurality of metal leads, each lead having an inner and an outer portion;
a plurality of metal heat sinks adjacent to each other, each heat sink having a first surface adjacent to the inner portions of the leads and a second surface opposite to the first surface, the first surface having a recess and a peripheral portion surrounding the recess and adjacent to the inner portions of the leads; and,
respective pluralities of metal support members having inner end portions connected to and supporting respective ones of the heat sinks.

17. The lead frame of claim 16, wherein the inner end portions of the support members are down-set relative to the leads.

18. The lead frame of claim 16, wherein at least one of the support members connected to and supporting a respective one of each of the heat sinks comprises a respective one of the leads.

19. The lead frame of claim 18, wherein the inner end portions of the respective ones of the leads are connected to the respective heat sinks with an electrically conductive connection.

20. The lead frame of claim 18, wherein the inner end portions of the respective ones of the leads extend between the respective heat sinks and an adjacent one of the heat sinks.

21. A semiconductor package, comprising:
a monolithic package body formed of a molded dielectric material;
a plurality of metal leads, each lead having an inner portion encapsulated within the package body and an outer portion extending exteriorly thereof;
a plurality of metal heat sinks encapsulated within the package body, each heat sink having opposite first and second surfaces, the first surface being disposed adjacent to the inner portions of the leads and having a recess and a peripheral portion surrounding the recess;
a plurality of semiconductor dies, each die being mounted in the recess of a respective one of the heat sinks and having a back surface attached to and in electrical connection therewith; and,
a plurality of electrically conductive wires, each wire being bonded between the peripheral portion of the first surface of a respective one of the heat sinks and the inner end portion of a respective one of the leads.

22. The semiconductor package of claim 21, wherein at least one of the inner portions of the leads and the peripheral portion of the first surface of each of the heat sinks is plated with a material that facilitates the bonding of wires thereto.

23. The semiconductor package of claim 21, wherein the second surface of each of the heat sinks has a recessed shoulder extending around a periphery thereof.

24. The semiconductor package of claim 21, wherein at least a portion of the second surface of at least one of the heat sinks is exposed through a surface of the package body.

25. The semiconductor package of claim 21, wherein the plurality of metal leads and heat sinks comprises a single unit in a plurality of identical units attached end-to-end in the form of a strip, and wherein the semiconductor package comprises one of a plurality of semiconductor packages assembled on the strip and singulated therefrom.

26. A semiconductor package, comprising:
   a monolithic package body of a dielectric material;
   a plurality of metal leads, each lead having an inner portion encapsulated within the package body and an outer portion exposed exteriorly thereof;
   a plurality of metal support members encapsulated within the package body, each support member having an inner end portion;
   a plurality of metal heat sinks encapsulated within the package body, each heat sink being electrically connected to and supported by the inner end portions of a respective two or more of the support members and having opposite first and second surfaces, the first surface of each heat sink being supported adjacent to the inner portions of the leads and having a recess and a peripheral portion surrounding the recess; and,
   a plurality of semiconductor dies, each die being mounted in the recess of a respective one of the heat sinks and having a back surface attached to and in electrical connection therewith.

27. The semiconductor package of claim 26, wherein at least one of the inner portions of the leads and the peripheral portion of the first surface of each of the heat sinks is plated with a material that facilitates the bonding of conductive wires thereto, and further comprising a plurality of conductive wires, each wire having a first end bonded to a respective one of the inner ends of the leads and a second end bonded to the peripheral portion of the first surface of a respective one of the heat sinks.

28. The semiconductor package of claim 26, wherein at least a portion of the second surface of at least one of the heat sinks is exposed through the package body.

29. The semiconductor package of claim 26, wherein the inner end portion of each support member is down-set with respect to the leads.

30. The semiconductor package of claim 26, wherein the inner end portions of at least one of each of the respective two or more support members supporting a respective one of the heat sinks extends between the respective heat sink and an adjacent one of the heat sinks.

* * * * *